(12) United States Patent
Fu et al.

(10) Patent No.: US 7,947,430 B2
(45) Date of Patent: May 24, 2011

(54) METHOD OF FORMING 3D MICRO STRUCTURES WITH HIGH ASPECT RATIOS

(75) Inventors: Chien-Chung Fu, Hsinchu (TW); Heng-Chi Huang, Jhudong Township, Hsinchu County (TW); Wen-Cheng Yang, Chiayi (TW)

(73) Assignee: National Tsing Hua University, Hsinchu (TW)

( * ) Notice: Subject to any disclaimer, the term of this patent is extended or adjusted under 35 U.S.C. 154(b) by 729 days.

(21) Appl. No.: 12/007,018

(22) Filed: Jan. 4, 2008

(65) Prior Publication Data
US 2008/0233522 A1    Sep. 25, 2008

(30) Foreign Application Priority Data

Mar. 22, 2007  (TW) ................................ 96109828 A

(51) Int. Cl.
*G03F 7/20* (2006.01)
(52) U.S. Cl. ........................................ 430/311; 430/396
(58) Field of Classification Search .................. 430/311, 430/322, 394, 396
See application file for complete search history.

(56) References Cited

FOREIGN PATENT DOCUMENTS

| JP | 2004255680 A | 9/2004 |
|---|---|---|
| JP | 2005314115 A | 11/2005 |
| TW | 1271787 | 9/1994 |
| TW | 200710018 A | 7/1995 |
| TW | 200642945 A | 12/2006 |

OTHER PUBLICATIONS

Huang, H et al., Journal of Micromechanics and Microengineering, 17 (2007) 291-296, "3D high aspect ratio micro structures fabricated by one step UV lithography".

*Primary Examiner* — Kathleen Duda
(74) *Attorney, Agent, or Firm* — Muncy, Geissler, Olds & Lowe, PLLC

(57) ABSTRACT

A method of forming 3D micro structures with high aspect ratios includes the steps of: disposing a mask, which has a plurality of through holes having at least two different sizes, on a substrate to expose the substrate through the through holes; forming a negative photoresist layer on the mask and the substrate; providing a light source to illuminate the negative photoresist layer through the substrate and the through holes of the mask so as to form a plurality of exposed portions and an unexposed portion; and removing the unexposed portion and leaving the exposed portions to form a plurality of pillars each having a bottom portion contacting the substrate and a top portion opposite to the bottom portion. A top area of the top portion is slightly smaller than a bottom area of the bottom portion, and the pillars are allowed to have at least two different heights.

9 Claims, 4 Drawing Sheets

METHOD OF FORMING 3D MICRO STRUCTURES WITH HIGH ASPECT RATIOS

BACKGROUND OF THE INVENTION

1. Field of Invention

The invention relates to a method of forming three-dimensional (3D) micro structures with high aspect ratios.

2. Related Art

LIGA is the abbreviation of German "Lithographie, Galvanoformung und Abformung", which means lithography, electroplating and molding. The LIGA process uses a mask and the X-ray having high linearity but requiring synchronous radiation to manufacture a micro structure having a pattern with a high aspect ratio (e.g., 50:1 or larger), wherein the fabricated micro structure may be an end product or a mold for proceeding the molding process such as hot embossing.

Applications and improvements to the LIGA technology may be found in the commonly invented applications: (a) U.S. patent application Ser. No. 11/446,111 (US20060275711A1), filed on Jun. 5, 2006, and entitled "METHOD OF MANUFACTURING A LIGA MOLD BY BACKSIDE EXPOSURE"; and (b) U.S. patent application Ser. No. 11/798,884, filed on May 17, 2007, and entitled "METHOD OF MANUFACTURING HOLLOW MICRO-NEEDLE STRUCTURES".

The mold manufactured according to the method of the application (a) is advantageous to the de-molding process. The mold manufactured according to the method of the application (b) is advantageous to the manufacturing of a solid/hollow diversified micro needle array to be applied to the biometrics test or inspection.

SUMMARY OF THE INVENTION

It is therefore an object of the invention to provide a method of forming 3D micro structures with high aspect ratios so that the micro structures with different heights can be formed. These micro structures can be applied to a photon crystal, a diffractive element, and elements for filtering, absorbing and reflecting acoustic waves, electromagnetic waves and light waves.

To achieve the above-identified object, the invention provides a method of forming 3D micro structures with high aspect ratios. The method includes the steps of: (a) disposing a mask on a substrate, which has a plurality of through holes having at least two different sizes, to expose the substrate through the through holes; (b) forming a negative photoresist layer on the mask and the substrate; (c) providing a light source to illuminate the negative photoresist layer through the substrate and the through holes of the mask so as to form a plurality of exposed portions and an unexposed portion; and (d) removing the unexposed portion and leaving the exposed portions to form a plurality of pillars, each of which has a bottom portion contacting the substrate and a top portion opposite to the bottom portion, wherein a top area of the top portion is smaller than a bottom area of the bottom portion, and the pillars have at least two different heights.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

To extend the above-mentioned two applications, the present inventors provide a method of forming 3D micro structures with high aspect ratios according to the LIGA technology. The micro structures manufactured according to this method can be applied to a photon crystal, a diffractive element, and elements for filtering, absorbing and reflecting acoustic waves, electromagnetic waves and light waves.

In this invention, the ultra-violet rays are provided to illuminate a negative photoresist layer to form pillars in the negative photoresist layer according to the slight converging property of the ultra-violet rays, and the sizes of the pillars may be controlled by controlling the sizes of through holes of a mask.

FIGS. 1 to 5 are schematic illustrations showing various steps in a method of forming micro structures according to a preferred embodiment of the invention. Referring to FIGS. 1 to 5, the method of the invention includes the following steps.

Figure 1:
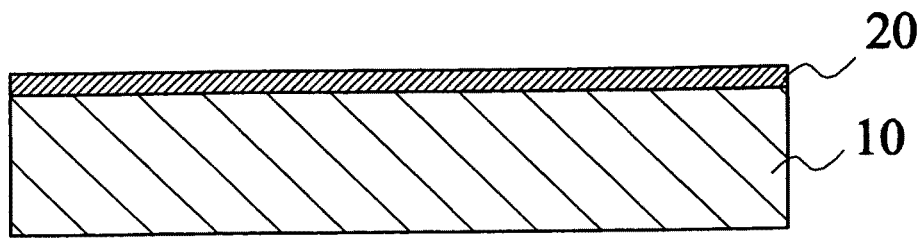
FIGS. 1 to 5 are schematic illustrations showing various steps in a method of forming micro structures according to a preferred embodiment of the invention.

First, a mask layer 20 is formed on a substrate 10, as shown in FIG. 1. The substrate 10 may be made of quartz, glass, a polymeric material, a cyclo-olefin copolymer (COC) or silicon. The mask layer 20 may be made of a metal material, such as chromium.

Figure 2:
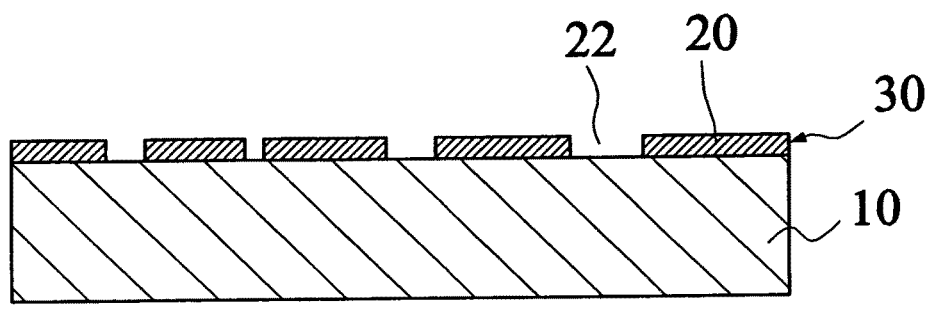

Then, the mask layer 20 is patterned to form a plurality of through holes 22 having at least two different sizes so that the substrate 10 is exposed through the through holes 22, as shown in FIG. 2. The mask layer 20 having the through holes 22 is defined as a mask 30. It is to be noted that the mask 30 may also be formed in advance, and is then directly placed on the substrate 10.

Figure 3:
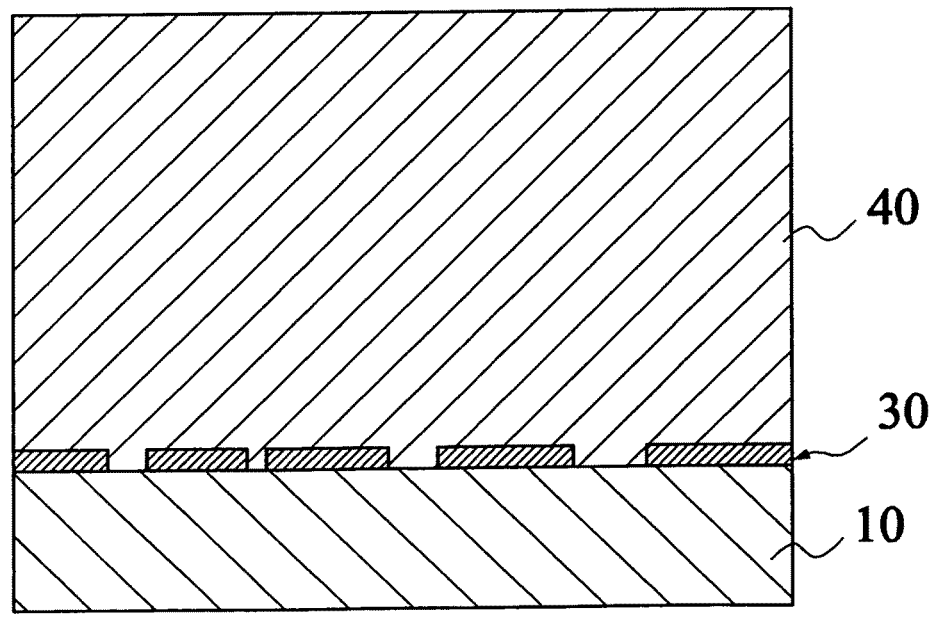
Figure 4:
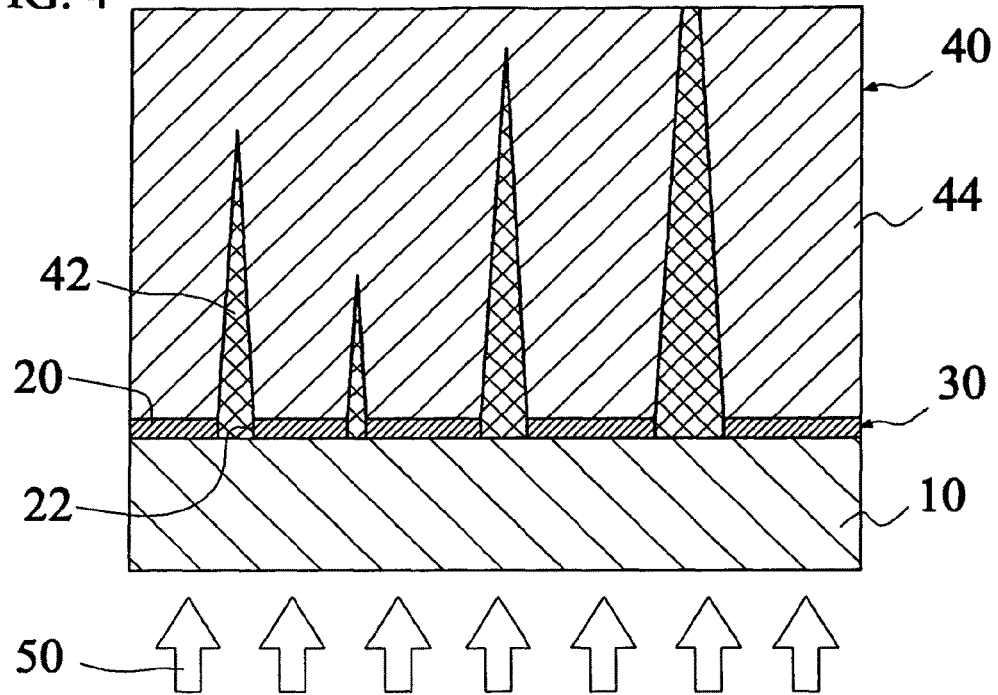
Figure 5:
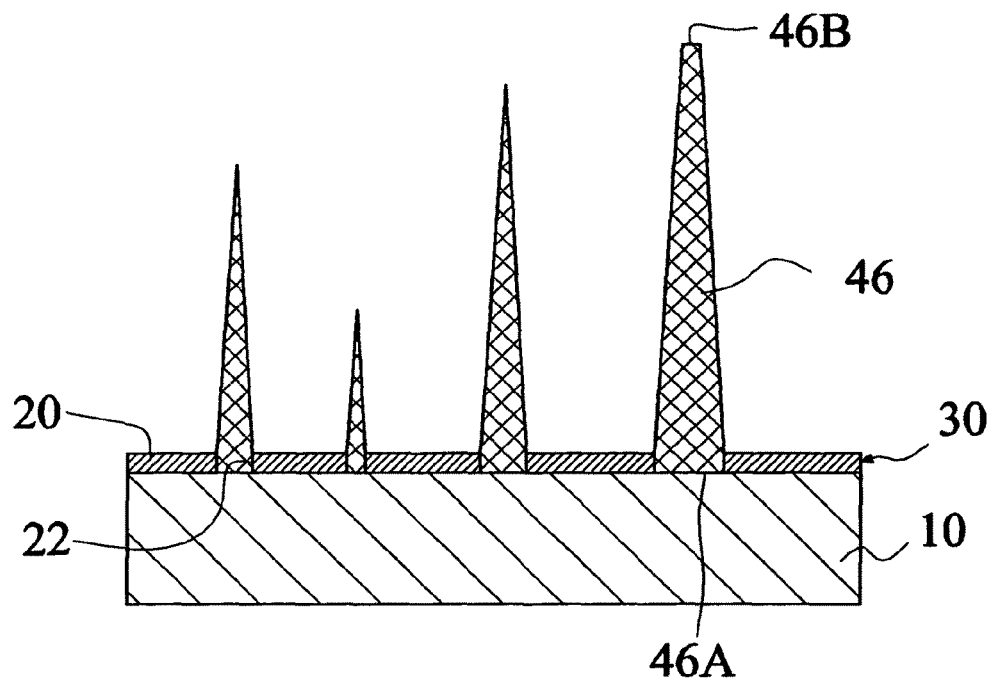

Next, a negative photoresist layer 40 is formed on the mask 30 and the substrate 10, as shown in FIG. 3. For example, a negative photoresist material (e.g., the SU-8 material) may be spin-coated onto the substrate 10, and then the negative photoresist material is solidified to form the negative photoresist layer 40.

Then, a light source 50 is provided to illuminate the negative photoresist layer 40 through the substrate 10 and the through holes 22 of the mask 30 to form a plurality of exposed portions 42 and an unexposed portion 44. In this embodiment, the light source 50 is an ultra-violet light source. In another embodiment, the light source 50 may be a laser light source, an X-ray source or a synchronous radiating light source. In order to make the micro structures have the sufficient hardness, the exposed portions 42 and the unexposed portion 44 of the negative photoresist layer 40 can be backed to harden the exposed portions 42.

Finally, the unexposed portion 44 is removed by way of development so that the exposed portions 42 are left to form a plurality of pillars 46. Each pillar 46 has a bottom portion 46A contacting the substrate 10 and a top portion 46B opposite to the bottom portion 46A. A top area of the top portion 46B is smaller than a bottom area of the bottom portion 46A. The pillars 46 have at least two different heights. The top area may also approximate to zero. That is, the pillar 46 may have a tip end.

Thus, controlling the sizes and the positions of the through holes 22 can control the pattern of the mask 30 and thus the sizes and the positions of the pillars.

Figure 6:
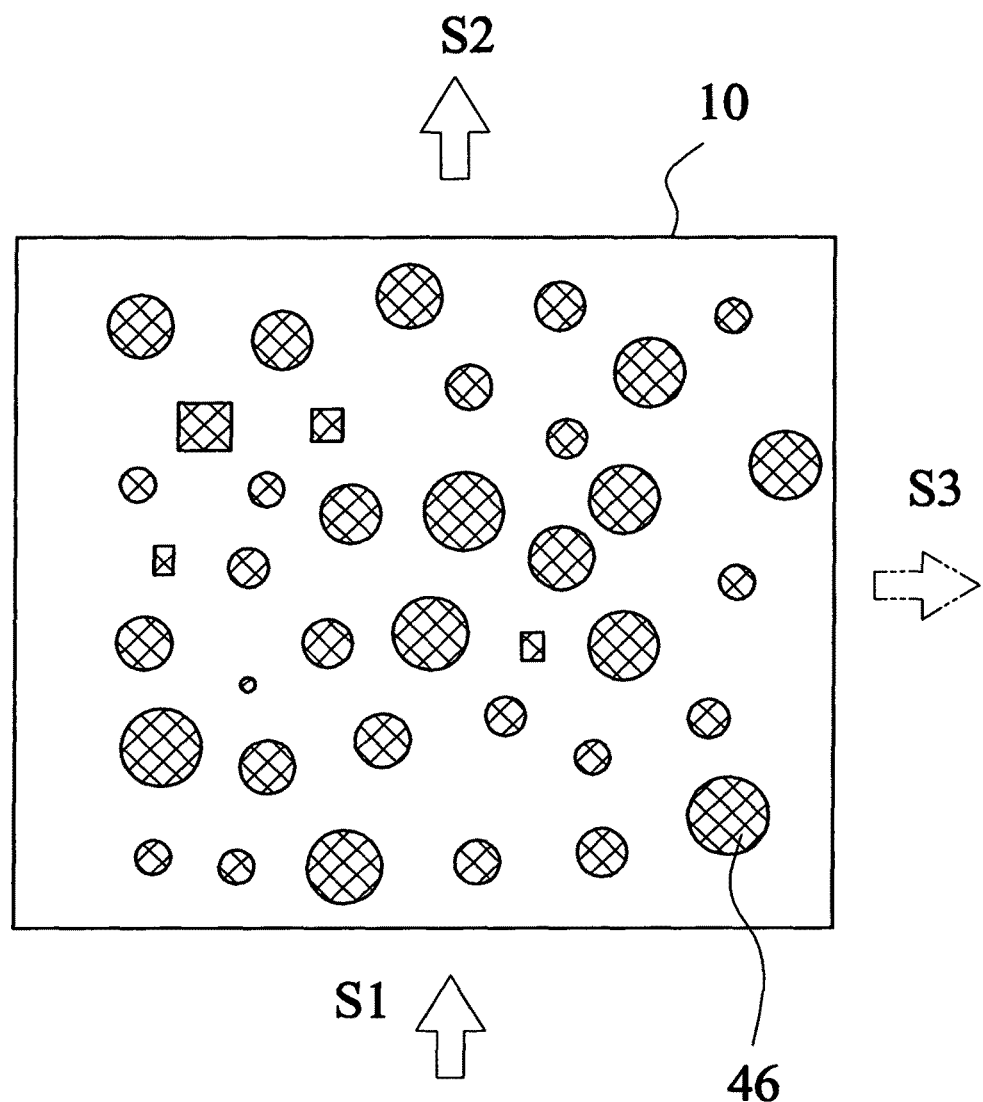
FIG. 6 is a cross-sectional view taken along a horizontal surface to show an example of the micro structures manufactured according to the method of the invention.

FIG. 6 is a cross-sectional view taken along a horizontal surface to show an example of the micro structures manufactured according to the method of the invention. As shown in FIG. 6, the pillars 46 may be designed to have different heights and arrangements in order to process an input signal S1, which enters the micro structures, into an output signal S2 or S3. Thus, the micro structures manufactured according to this method can be applied to a photon crystal, a diffractive element and elements for filtering, absorbing and reflecting acoustic waves, electromagnetic waves and light waves. It is to be noted that the shape of the cross-section of the bottom portion of the pillar depends on the shape of the through hole 22, and is not restricted to the circular shape but may also be a rectangular shape, a square shape, a triangular shape or a polygonal shape.

FIG. 6 shows an in-plane application, wherein an incident wave (or input signal) and an output wave (or output signal) are located on the same plane. It is to be noted that the micro structures of the invention may also be applied to an out-of-plane occasion, as shown in FIG. 7.

Figure 7:
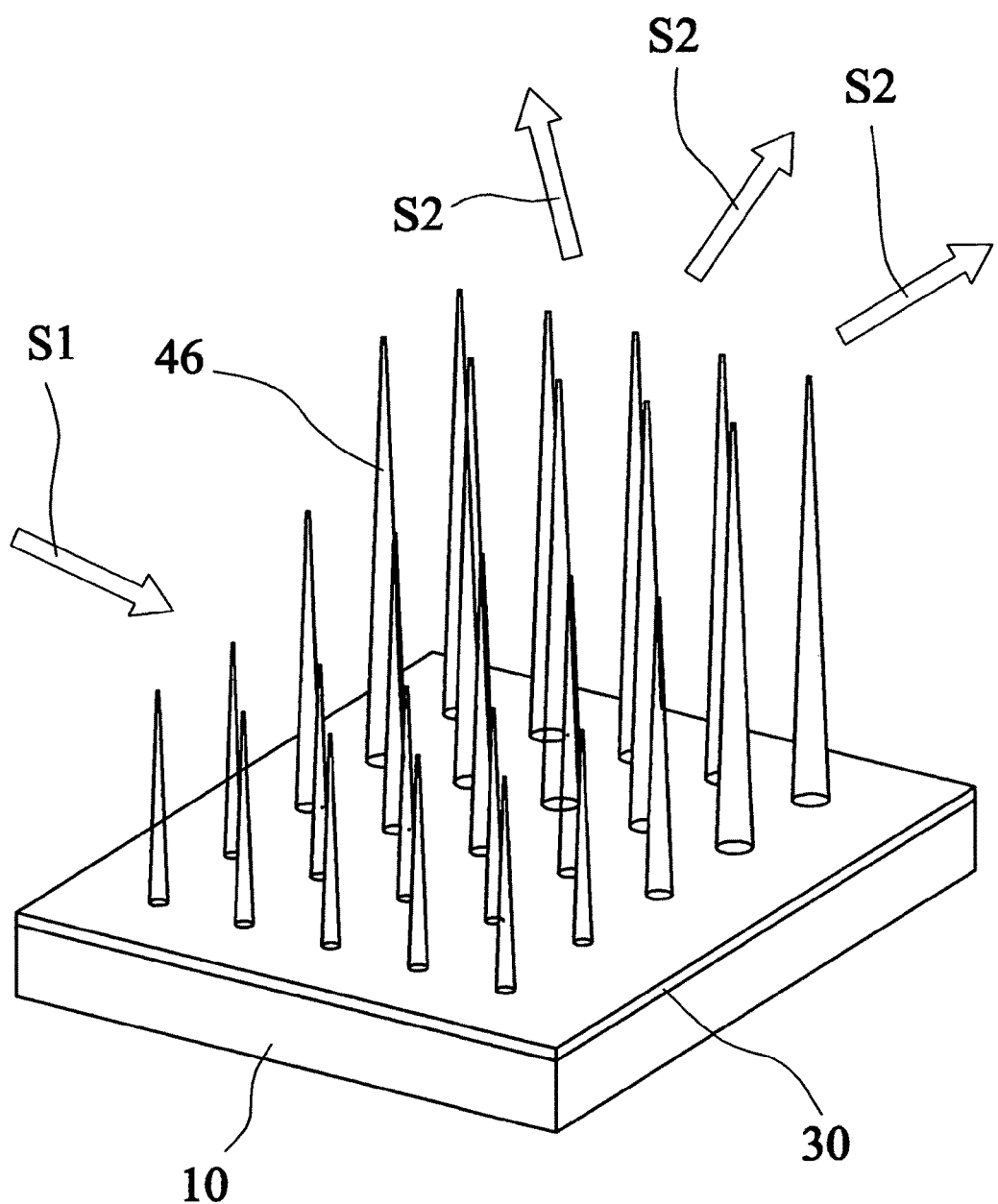
FIG. 7 is a pictorial view showing another example of micro structures manufactured according to the method of the invention.

FIG. 7 is a pictorial view showing another example of micro structures manufactured according to the method of the invention. As shown in FIG. 7, the incident wave (or input signal) S1 and the output wave (or output signal) S2 are not located on the same plane.

Thus, it is proved that the method of the invention can be used to manufacture the 3D micro structures with the high aspect ratios. In addition, the feature of the invention is that the 3D structures with different high aspect ratios can be formed by one exposing step.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A method of forming 3D micro structures with high aspect ratios, the method comprising the steps of:
    (a) disposing a mask on a substrate, which has a plurality of through holes having at least two different sizes, to expose the substrate through the through holes;
    (b) forming a negative photoresist layer on the mask and the substrate;
    (c) providing a light source to illuminate the negative photoresist layer through the substrate and the through holes of the mask so as to form a plurality of exposed portions and an unexposed portion; and
    (d) removing the unexposed portion and leaving the exposed portions to form a plurality of pillars, each of which has a bottom portion contacting the substrate and a top portion opposite to the bottom portion, wherein a top area of the top portion is smaller than a bottom area of the bottom portion, and the pillars have at least two different heights.

2. The method according to claim 1, wherein the step (a) comprises:
    (a1) forming a mask layer on the substrate; and
    (a2) patterning the mask layer to form the through holes.

3. The method according to claim 2, wherein the mask layer is made of a metal material.

4. The method according to claim 2, wherein the mask layer is made of chromium.

5. The method according to claim 1, wherein the step (b) comprises:
    (b1) spin-coating a negative photoresist material onto the substrate; and
    (b2) solidifying the negative photoresist material to form the negative photoresist layer.

6. The method according to claim 1, wherein the substrate is made of quartz, glass, a polymeric material, a cyclo-olefin copolymer (COC) or silicon.

7. The method according to claim 1, wherein the light source is an ultra-violet light source, a laser light source, an X-ray source or a synchronous radiating light source.

8. The method according to claim 1, wherein the step (c) further comprises:
    baking the exposed portions and the unexposed portion of the negative photoresist layer.

9. The method according to claim 1, wherein the step (d) is performed by way of development.

* * * * *